(12) United States Patent
Taki et al.

(10) Patent No.: US 7,629,619 B2
(45) Date of Patent: Dec. 8, 2009

(54) GROUP III NITRIDE-BASED COMPOUND SEMICONDUCTOR LIGHT-EMITTING DEVICE AND METHOD FOR PRODUCING THE SAME

(75) Inventors: Tetsuya Taki, Aichi-ken (JP); Mitsuhisa Narukawa, Aichi-ken (JP); Masato Aoki, Aichi-ken (JP); Koji Okuno, Aichi-ken (JP); Yusuke Toyoda, Aichi-ken (JP); Kazuki Nishijima, Aichi-ken (JP); Shuhei Yamada, Aichi-ken (JP)

(73) Assignee: Toyota Gosei Co., Ltd., Nishikasugai-gun, Aichi-ken (JP)

( * ) Notice: Subject to any disclaimer, the term of this patent is extended or adjusted under 35 U.S.C. 154(b) by 125 days.

(21) Appl. No.: 11/340,746

(22) Filed: Jan. 27, 2006

(65) Prior Publication Data

US 2006/0169990 A1    Aug. 3, 2006

(30) Foreign Application Priority Data

Jan. 28, 2005   (JP) .............................. 2005-021445
Feb. 22, 2005   (JP) .............................. 2005-046283

(51) Int. Cl.
H01L 33/00   (2006.01)
(52) U.S. Cl. ..................... 257/96; 257/97; 257/103; 257/E33.028; 257/E33.034
(58) Field of Classification Search .................. 257/79, 257/85, 96, 103, E33.023, E33.026–E33.028, 257/E33.031–E33.034
See application file for complete search history.

(56) References Cited

U.S. PATENT DOCUMENTS

| | | | | |
|---|---|---|---|---|
| 5,684,309 A | * | 11/1997 | McIntosh et al. | 257/191 |
| 6,072,189 A | * | 6/2000 | Duggan | 257/14 |
| 6,674,778 B1 | * | 1/2004 | Lin et al. | 372/46.01 |
| 2004/0135136 A1 | * | 7/2004 | Takahashi et al. | 257/14 |

FOREIGN PATENT DOCUMENTS

| | | |
|---|---|---|
| JP | 64-017484 | 1/1989 |
| JP | 10-84132 | 3/1998 |
| JP | 10-107319 | 4/1998 |
| JP | 11-026812 | 1/1999 |
| JP | 2000-340839 | 12/2000 |
| JP | 2001-230447 | 8/2001 |
| JP | 2004-253819 | 9/2004 |

OTHER PUBLICATIONS

Chinese Office Action dated Aug. 3, 2007, with partial English translation.

* cited by examiner

*Primary Examiner*—Anh Phung
*Assistant Examiner*—Allison P Bernstein
(74) *Attorney, Agent, or Firm*—McGinn IP Law Group, PLLC (57) ABSTRACT

A Group III nitride-based compound semiconductor light-emitting device having a quantum well structure, includes a well layer, a first layer formed on one surface of the well layer, a second layer formed on the other surface of the well layer, a first region provided in the vicinity of the interface between the first layer and the well layer, and a second region provided in the vicinity of the interface between the second layer and the well layer. A composition of the first and second regions gradually changes such that the lattice constants of the first and second layers approach the lattice constant of the well layer as a position approaches said well layer.

13 Claims, 9 Drawing Sheets

GROUP III NITRIDE-BASED COMPOUND SEMICONDUCTOR LIGHT-EMITTING DEVICE AND METHOD FOR PRODUCING THE SAME

BACKGROUND OF THE INVENTION

1. Field of the Invention

The present invention relates to a Group III nitride-based compound semiconductor light-emitting device having a quantum well structure.

The invention also relates to a method for producing a Group III nitride-based compound semiconductor device or light-emitting device, and more particularly, to a method for growing an indium-containing Group III nitride-based compound semiconductor layer.

2. Description of the Related Art

Conventionally, Group III nitride-based compound semiconductor light-emitting devices employ a multiple quantum well (MQW) structure in which layers having different bandgap energies are alternatingly stacked at a predetermined number of repetitions of a stacked layer cycle. Examples include a blue-light-emitting diode (LED) and a green-light-emitting LED, employing a multiple quantum well (MQW) structure in which well layers $In_{0.2}Ga_{0.8}N$ (thickness: 2.5 nm) and barrier layers (thickness: 5 nm) formed of $In_{0.05}Ga_{0.95}N$ or GaN are alternatingly stacked. Other examples include a blue-light-emitting diode (LED) and a green-light-emitting LED, employing a single quantum well (SQW) structure having a single well layer (thickness: about 3 nm) Recently, near-UV-light-emitting LEDs (emission wavelength: about 380 nm) and laser diodes (LD) emitting a blue-purple light (405 nm) have been proposed. These proposed devices have a structure in which an InGaN well layer is interposed between AlGaN barrier layers.

Figure 1:
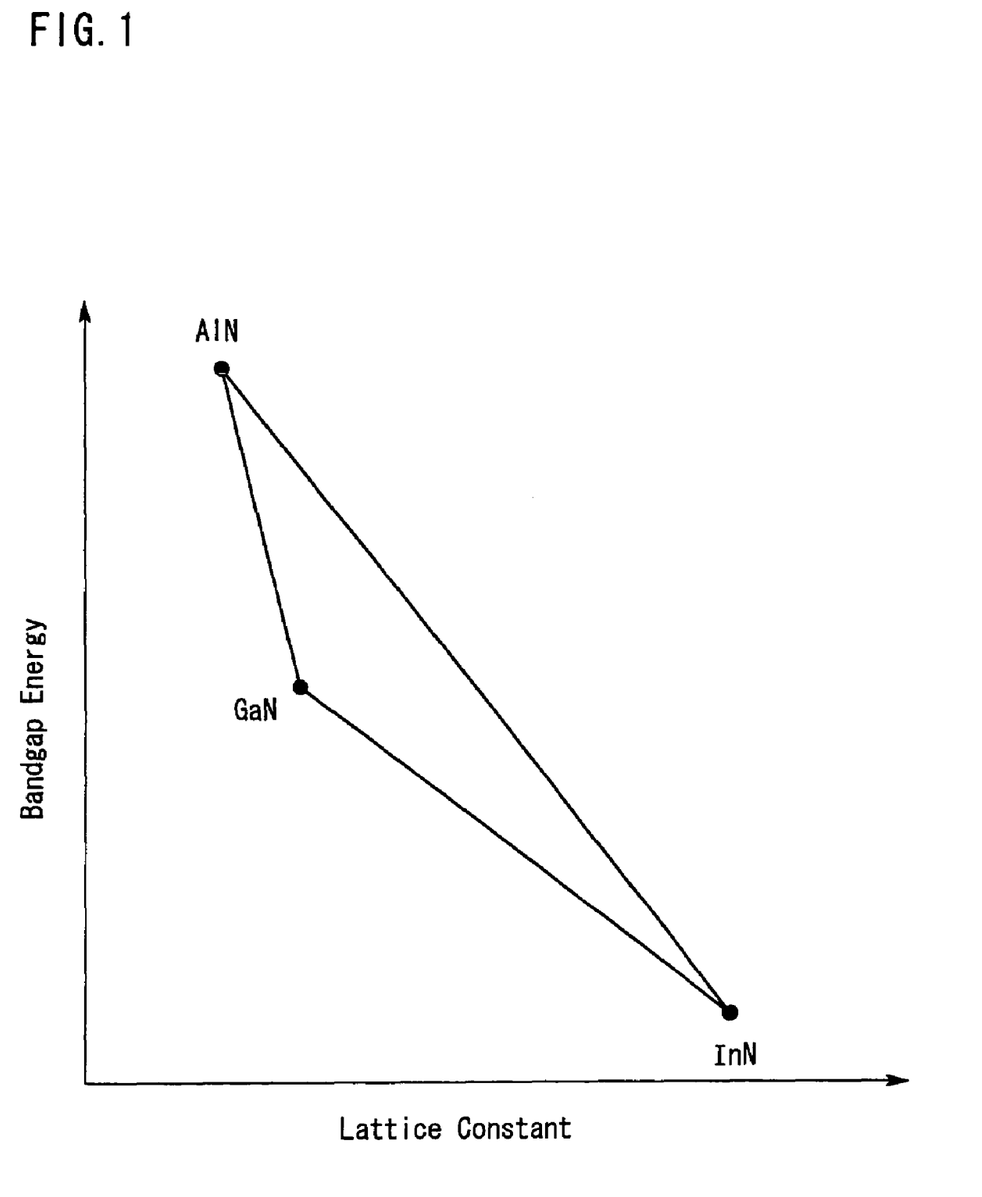
FIG. 1 is a graph showing the relationship between material composition and lattice constant in a Group III nitride-based compound semiconductor.

Generally, when a heterojunction structure selected from the above structures has defects caused by lattice mismatch at a heterojunction interface, a light-emitting device employing such a heterojunction exhibits decreased light intensity and output as well as shortened service life due to deterioration, which are problematic. Characteristics of semiconductor per se also cause problems, since, as shown in FIG. 1, Group III nitride-based compound semiconductors have different lattice constants in accordance with the element compositions and compositional proportions. Among these problems, dislocation occurs in recent LEDs emitting near-UV light (about 380 nm) and LDs emitting a blue-purple light (405 nm) employing an AlGaN barrier layer.

Japanese Patent Application Laid-Open (kokai) Nos. 64-17484, 11-26812, and 2001-230447 disclose means for solving the aforementioned problems related to lattice mismatch in Group III nitride-based compound semiconductor light-emitting devices.

Meanwhile, an indium-containing Group III nitride-based compound semiconductor layer is employed as a narrowest-bandgap layer in a Group III nitride-based compound semiconductor light-emitting device exhibiting a wide bandgap. For example, an indium-containing Group III nitride-based compound semiconductor layer is an important layer for serving as a light-emitting layer in a light-emitting device. When the indium-containing Group III nitride-based compound semiconductor layer is interposed between aluminum-containing Group III nitride-based compound semiconductor layers, mutual diffusion of indium and aluminum is known to occur. The diffusion is conceived to be caused by thermal diffusion occurring in the growth layer during epitaxial growth, a so-called memory effect of the reaction system in a production apparatus, and migration as contaminants. These features are disclosed in Japanese Patent Application Laid-Open (kokai) Nos. 10-107319, 2000-340839, and 2004-253819

SUMMARY OF THE INVENTION

The means as disclosed in Japanese Patent Application Laid-Open (kokai) No. 64-17484 is intended only to relax lattice mismatch. In Examples 1 and 2 of the relevant specification, a three-component InGaN light-emitting layer is interposed between two single layers of four-component AlInGaN serving as current-injection layers (cladding layers). However, four-component AlInGaN having high crystallinity is not realized. Thus, even though lattice mismatch is mitigated, excellent emission intensity and output intensity, which are the most important characteristics of light-emitting devices, cannot be attained.

In the means disclosed in Japanese Patent Application Laid-Open (kokai) No. 11-26812, the In composition is continuously varied. Specifically, the In composition of a well layer serving as a light-emitting layer is virtually matched with that of the interface between the well layer and the barrier layer, and the In composition reaches the highest value at a virtual center in the thickness direction. However, when the In composition of the well layer is varied, a plurality of energy levels are generated in the well layer, resulting in a number of emission levels; i.e., a number of emission wavelengths, which is not preferred. Furthermore, since the well layer is generally very thin, the In composition is difficult to vary in the well layer.

In the means disclosed in Japanese Patent Application Laid-Open (kokai) No. 2001-230447, an AlGaN layer is interposed between an aluminum nitride (AlN) buffer layer and a gallium nitride (GaN) n-contact layer, so as to vary the Al composition stepwise, in order to relax lattice mismatch between the substrate and the n-contact layer. However, the document neither discloses nor suggests the mode of application of the structure and applicability thereof to the light-emitting layer.

Thus, in view of the foregoing, an object of the present invention is to provide a Group III nitride-based compound semiconductor light-emitting device having a quantum well structure, which device suppresses generation of misfit dislocations at a region in the vicinity of the interface to the well layer, thereby preventing generation of edge dislocations originating from misfit dislocations, and in turn enhancing crystallinity and device characteristics (emission intensity, output intensity, and service life).

Conventionally, approaches of providing a steep change in semiconductor composition at an interface between adjacent component layers have been extensively studied. However, such efforts have so far failed to come up with a practically employable technique which ensures creation of such a steep compositional change. Meanwhile, the present inventors have found that, in some semiconductor devices, the real technical problems to be solved may be generation of an unintended composition at an interface between adjacent component layers and compositional instability in the lateral direction of a layer of a wafer or a device, rather than failure to attain steep compositional change.

For example, in a light-emitting layer of a light-emitting device, it is important that electrons and holes are recombined, for example, at around the mid portion of a light-emitting layer of interest, causing light emission. If recombination of electrons and holes at the mid portion is not disturbed, a steep compositional change is not necessarily needed at the interfaces between the light-emitting layer and a layer in contact with the light-emitting layer.

Figure 5A:
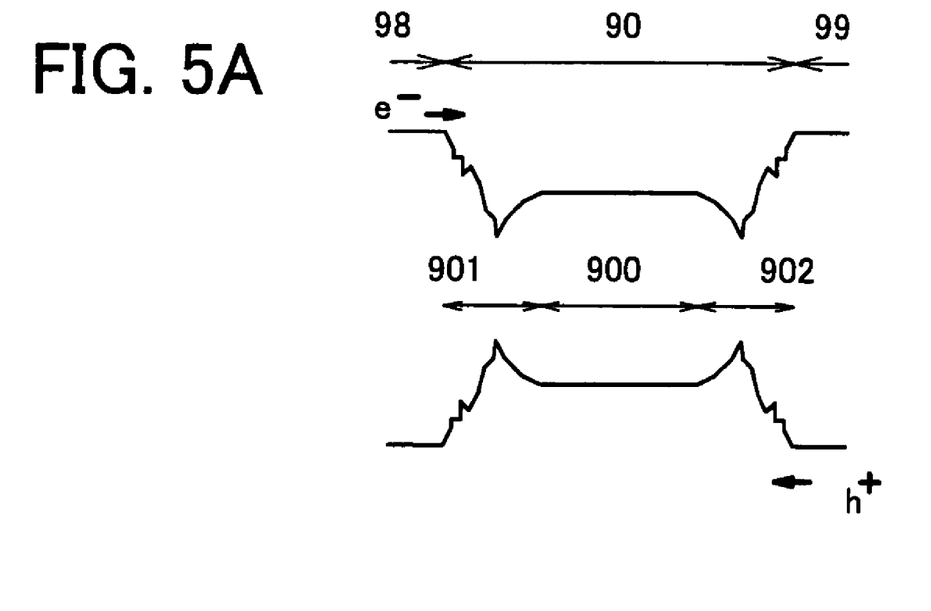
FIGS. 5A and 5B are band diagrams for showing the effects the present invention.

A more detailed description will be provided with reference to FIGS. 5A and 5B. FIG. 5A is a graph showing a hypothetical band structure in relation to the case in which compositionally unstable regions—i.e., regions vulnerable to compositional change—are formed in areas in the vicinity of interfaces between a light-emitting layer and a layer in contact with the light-emitting layer. As shown in FIG. 5A, a compositionally unstable region 901 is formed in the vicinity of the interface between a light-emitting layer 90 and an n-type layer 98, and includes a conduction band lower than that of a mid portion 900 of the light-emitting layer 90. Electrons tend to reside in the lower conduction band. Similarly, a compositionally unstable region 902 is formed in the vicinity of the interface between the light-emitting layer 90 and a p-type layer 99, and includes a valence band higher than that of the mid portion 900 of the light-emitting layer 90. Holes tend to reside in the higher valence band. In the hypothetical state, electrons injected through the n-type layer 98 (on the left side in FIG. 5A) remain in the compositionally unstable region 901 formed in the vicinity of the interface between the light-emitting layer 90 and the n-type layer 98, whereas holes injected through the p-type layer 99 (on the right side in FIG. 5A) remain in the compositionally unstable 902 formed in the vicinity of the interface between the light-emitting layer 90 and the p-type layer 99. Thus, in the light-emitting layer 90 having such a band structure, recombination of electrons and holes for causing light emission is conceived to occur only in the mid portion 900 of the light-emitting layer 90. Therefore, emission efficiency is thought to be reduced.

Figure 5B:
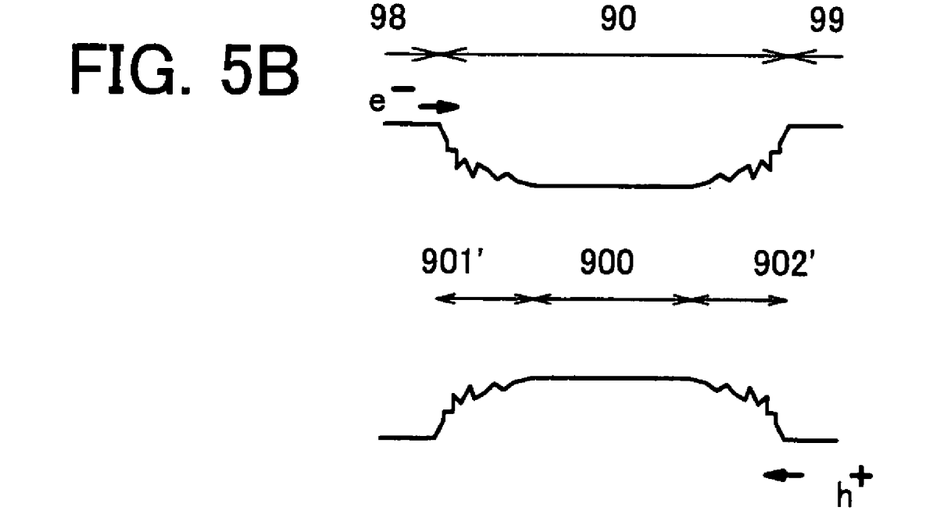

In contrast, as shown in FIG. 5B, when a compositionally unstable region 901' not including a conduction band lower than that of the mid portion 900 of the light-emitting layer 90, and a compositionally unstable region 902' not including a valence band higher than that of the mid portion 900 of the light-emitting layer 90 are provided instead of the compositionally unstable regions 901 and 902, emission efficiency is thought to be enhanced.

The present invention has been accomplished by experimentally verifying the effectiveness of the above hypothesis.

The aforementioned problems are solved by the following. Accordingly, in a first aspect of the present invention, there is provided a Group III nitride-based compound semiconductor light-emitting device having a quantum well structure, the device comprising:

a well layer, a first layer formed on one surface of the well layer, a second layer formed on the other surface of the well layer, a first region provided in the vicinity of the interface between the first layer and the well layer, and a second region provided in the vicinity of the interface between the second layer and the well layer, wherein the first and second regions are formed such that the lattice constants of the first and second layers approach the lattice constant of the well layer. Through employment of the structure, generation of misfit dislocations in regions of the well layer in the vicinity of the interfaces and generation of a plurality of energy levels in the well layer can be suppressed, whereby crystallinity of the well layer and device characteristics can be enhanced.

Preferably, the first and second regions are formed within the first and second layers, respectively. Through employment of the structure, the composition can be continuously varied from the first and second layers to the well layer by the mediation of the first and second regions without providing additional layers.

Preferably, the first and second layers are cladding layers. In a single quantum well structure, the first and second layers also serve as cladding layers. Thus, by virtue of the presence of the regions, generation of misfit dislocations in regions of the well layer in the vicinity of the interfaces and generation of a plurality of energy levels in the well layer can be suppressed, whereby crystallinity of the well layer and device characteristics can be enhanced.

Preferably, the first and second layers are barrier layers. Also in the case of a multiple quantum well (MQW) structure, by virtue of the presence of the regions, generation of misfit dislocations in regions of the well layer in the vicinity of the interfaces and generation of a plurality of energy levels in the well layer can be suppressed, whereby crystallinity of the well layer and device characteristics can be enhanced.

Preferably, the first and second layers are formed of $Al_xGa_{1-x}N$ (0<x<1), the well layer is formed of $In_yGa_{1-y}N$ (0<y<1), and the first and second regions are formed of $Al_{x'}Ga_{1-x'}N$ (0≦x'<1) and are formed such that x' varies from x to 0. Through employment of a three-component Group III nitride semiconductor of high crystallinity and, at the interfaces to the well layer, GaN (i.e., $Al_{x'}Ga_{1-x'}N$ (x'=0)) having the highest crystallinity, generation of misfit dislocations in regions of the well layer in the vicinity of the interfaces and generation of a plurality of energy levels in the well layer can be suppressed, whereby crystallinity of the well layer and device characteristics can be enhanced.

Preferably, the first and second layers are formed of $Al_xGa_{1-x}N$ (0<x<1), the well layer is formed of $In_yGa_{1-y}N$ (0<y<1), and each of the first and second regions is formed of $In_{y'}Ga_{1-y'}N$ (0≦y'<1) and $Al_{x'}Ga_{1-x'}N$ (0≦x'<1), the former composition being closer to the well layer, wherein y' varies from y to 0 and x' varies from 0 to x, as the distance from the well layer increases. Through combined employment of three-component Group III nitride semiconductors (AlGaN and InGaN) of high crystallinity and GaN (i.e., $Al_{x'}Ga_{1-x'}N$ (x'=0) or $In_{y'}Ga_{1-y'}N$ (y'=0)) having the highest crystallinity, generation of misfit dislocations in regions of the well layer in the vicinity of the interfaces and generation of a plurality of energy levels in the well layer can be suppressed, whereby crystallinity of the well layer and device characteristics can be enhanced.

In a second aspect of the present invention, there is provided a method for producing a Group III nitride-based compound semiconductor light-emitting device having a light-emitting layer of a single or multiple quantum well structure including at least an indium (In)-containing well layer, wherein, during formation of the well layer through vapor growth, an In source is fed through a procedure including: initiating feeding of the In source at a minimum feed rate; subsequently, elevating the In source feed rate to a target feed rate; maintaining the feed rate at the target feed rate; and subsequently, lowering the feed rate from the target feed rate to the minimum feed rate, and a Group III source other than the In source is fed at a constant feed rate from initiation of feeding of the In source to termination of the feeding. As used herein, the term "In source minimum feed rate" is an apparatus-dependent or a condition-dependent feed rate; i.e., a lower limit that can be controlled under relevant conditions. The minimum feed rate may be 0 or a positive value.

In a third aspect of the present invention, there is provided a method for producing a Group III nitride-based compound semiconductor device having at least an indium (In)-containing layer interposed between two layers, wherein, during formation of the In-containing layer through vapor growth, an In source is fed through a procedure including: initiating feeding of the In source at a minimum feed rate; subsequently, elevating the In source feed rate to a target feed rate; maintaining the feed rate at the target feed rate; and subsequently, lowering the feed rate from the target feed rate to the minimum feed rate, and a Group III source other than the In source is fed at a constant feed rate from initiation of feeding of the In source to termination of the feeding. The same definition can be applied to the minimum feed rate.

According to the first aspect of the present invention, generation of misfit dislocations at a region in the vicinity of the interface of the well layer can be suppressed, thereby preventing generation of edge dislocations originating from misfit dislocations and enhancing crystallinity. As a result, device characteristics such as emission intensity, output intensity, and service life of the produced semiconductor device can be enhanced. The effect is particularly remarkable when a three- or two-component semiconductor of high crystallinity is employed.

Figure 6A:
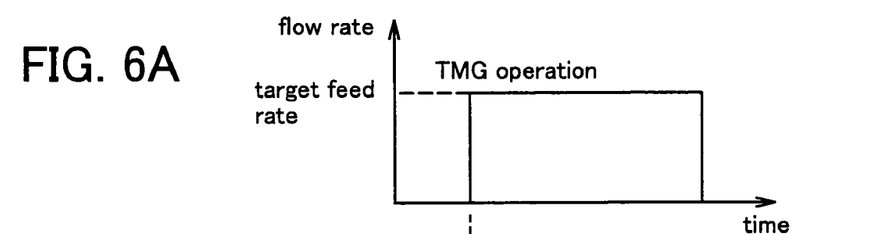
FIGS. 6A to 6C are graphs showing time-dependent change in metal source feed rate and concentration in the vicinity of epitaxial film, for describing the features of the present invention.
Figure 6B:
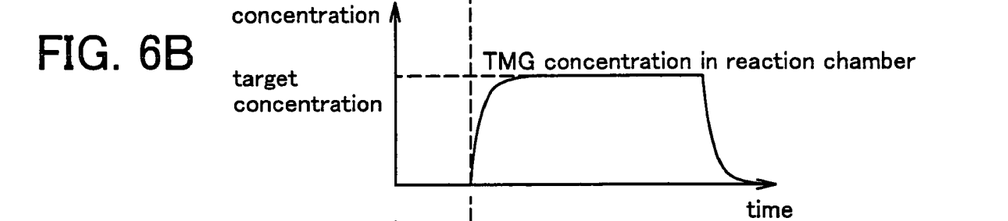
Figure 6C:
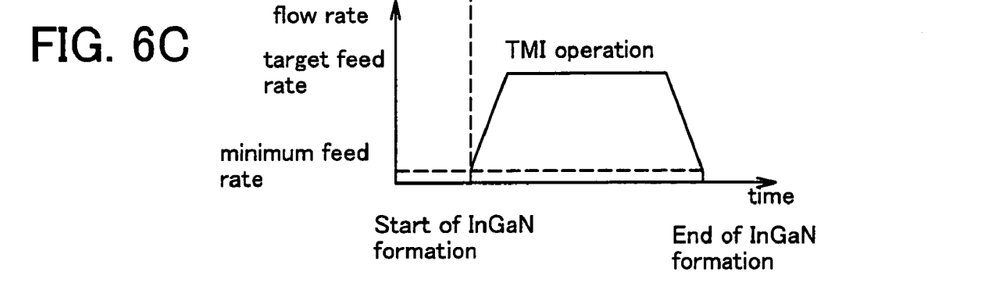

The effects of the second and third aspects of the present invention will be described. Generally, growth of an indium (In)-containing Group III nitride-based compound semiconductor layer is carried out at a temperature lower than the temperature at which other Group III nitride-based compound semiconductor layers are grown in a subsequent or a preceding step, since the indium (In)-containing Group III nitride-based compound semiconductor layer is readily decomposed. However, since the growth is carried out at low temperature, the formed layer has poor compositional uniformity, particularly with respect to the lateral direction. Therefore, a compositional-varying region readily forms at the interface between the indium (In)-containing layer and another layer. Thus, according to the present invention, the In composition at the above interface is controlled to a minimum level, and the In composition is adjusted to a target level around the mid portion of the In-containing layer. FIGS. 6A to 6C show the time-concentration profile. As shown in FIG. 6A, a mass flow controller and a shift valve are operated for feeding trimethylgallium (TMG) serving as a gallium source at a target feed rate. Conceivably, as shown in FIG. 6B, TMG concentration in the vicinity of the epitaxial growth surface increases exponentially to the target concentration, and decreases exponentially from the target concentration to 0. In the case of trimethylindium (TMI) serving as an indium source, the TMI concentration follows the above time-concentration profile. However, since TMI has a larger molecular weight and is more decomposable as compared with TMG, TMI may cause undesired instability in In concentration. Thus, as shown in FIG. 6C, a mass flow controller and a shift valve are operated for feeding (TMI) such that feeding is initiated at a minimum feed rate, the TMI feed rate is increased to a target feed rate, the feed rate is maintained at the target feed rate, and, subsequently, the feed rate is decreased from the target feed rate to the minimum feed rate. Through controlling the feed rate in the above manner, an undesired compositionally unstable region in the epitaxially grown film provided by "undesired variation in concentration" does not contain an excessive amount of In. Thus, an In-excessive portion is not provided, and the mid portion of the In-containing layer can be readily designed so as to have "the narrowest bandgap." Through application of the present invention to a light-emitting layer of a light-emitting device, particularly a well layer of a single or multiple quantum well structure, two interfaces between the well layer and a barrier layer have no compositionally unstable region. Therefore, the phenomenon that electrons and holes are isolated in different regions, which is indicated by the band structure shown in FIG. 5A, does not occur, resulting in enhancement in emission efficiency caused by promoted recombination of electrons and holes. The minimum feed rate is an apparatus-dependent minimum rate ensuring consistent feeding, and is preferably equal to or 5% higher than the target feed rate.

BRIEF DESCRIPTION OF THE DRAWINGS

Various other objects, features, and many of the attendant advantages of the present invention will be readily appreciated as the same becomes better understood with reference to the following detailed description of the preferred embodiments when considered in connection with the accompanying drawings, in which.

DETAILED DESCRIPTION OF PREFERRED EMBODIMENTS

The present invention will next be described in detail by way of examples.

Example 1

Figure 2:
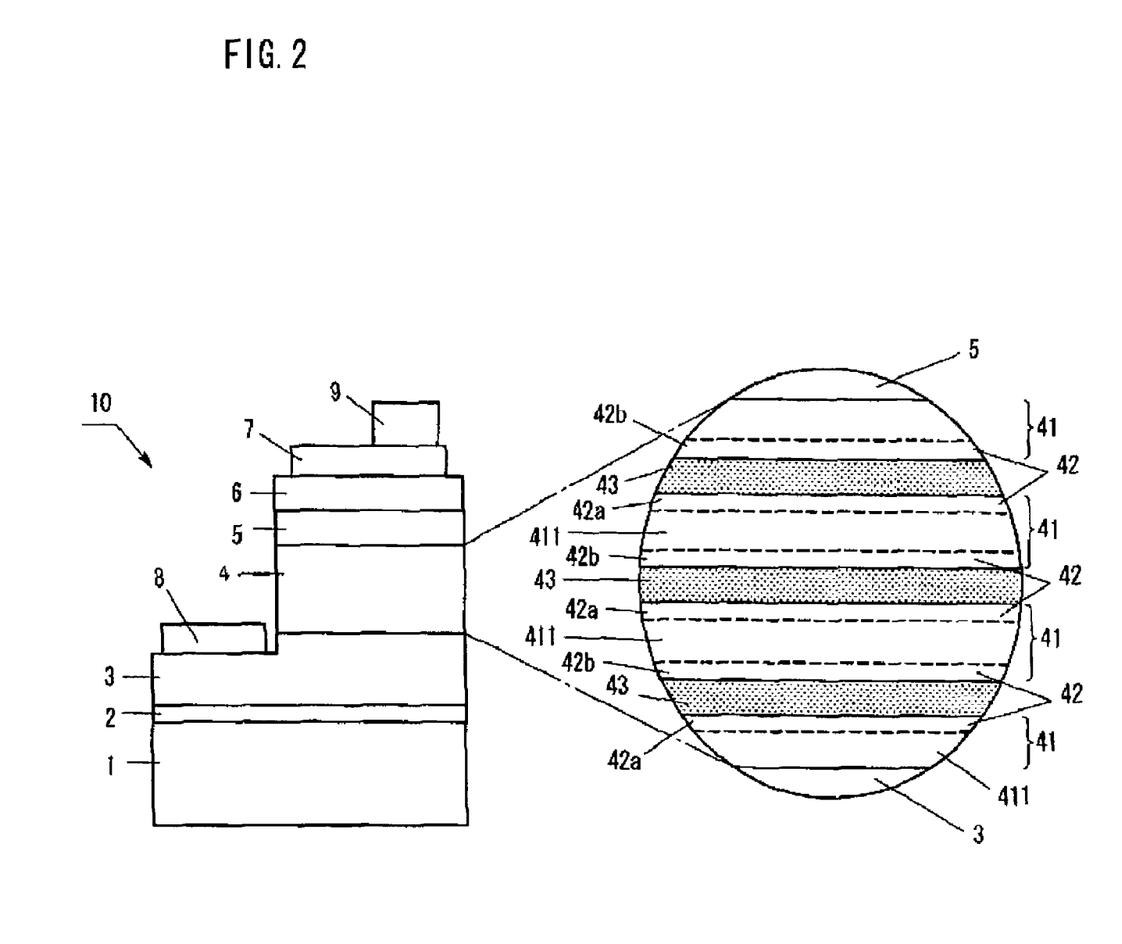
FIG. 2 is a schematic view of the structure of a Group III nitride-based compound semiconductor light-emitting device of Example 1 of the present invention.

FIG. 2 is a schematic cross-sectional view of a light-emitting device 10 fabricated from Group III nitride-based compound semiconductors. In the device, light is extracted through the top surface on the semiconductor layer formed on a sapphire substrate 1. On the substrate 1, an AlN buffer layer 2 (thickness: about 25 nm) and a high-carrier-concentration layer 3 (thickness: about 4.0 µm) formed of silicon (Si)-doped GaN are sequentially formed. On the high-carrier-concentration layer 3, there is formed a multiple quantum well layer 4 in which barrier layers 41 (thickness: about 8 nm) and $In_{0.1}Ga_{0.9}N$ well layers 43 (thickness: about 3 nm) are alternatingly stacked. Each barrier layer 41 includes a main region 411 formed of $Al_{0.1}Ga_{0.9}N$ and an interface region 42 (thickness: about 1.5 nm) which is in contact with the well layer 43. In an interface region 42a underneath the well layer 43, the Al composition of $Al_{0.1}Ga_{0.9}N$ in the main region 411 continuously decreases toward the upper side (as viewed in FIG. 2) to 0, to form GaN. Subsequently, the In composition continuously increases from 0, to thereby attain $In_{0.1}Ga_{0.9}N$, which is the same composition as that of the well layer 43. Meanwhile, in an interface region 42b on the well layer 43, the In composition of $In_{0.1}Ga_{0.9}N$ in the well layer 43 continuously decreases toward the upper side (as viewed in FIG. 2) to 0, to form GaN. Subsequently, the Al composition continuously increases from 0, to thereby attain $Al_{0.1}Ga_{0.9}N$, which is the same composition as that of the main region 411 of the barrier layer 41.

In Example 1, the multiple quantum well layer 4 is formed of four barrier layers 41 and three well layers 43. On the multiple quantum well layer 4, a p-type $Al_{0.4}Ga_{0.6}N$ cladding layer 5 (thickness: about 20 nm) and a p-type GaN contact layer 6 (thickness; about 100 nm) are sequentially formed. In Example 1, the thickness of each region 42 is adjusted to 1.5 nm, and the thickness of the region 42 preferably falls within a range of 1/40 to 3/8 the total thickness of the barrier layers 41. When the thickness of the regions 42 is excessive, a plurality of quantum levels are generated in the well layers 43 in accordance with the material composition of the barrier layers 41, resulting in the same problem as disclosed in Japanese Patent Application Laid-Open (kokai) No. 11-26812. When each region 42 is excessively thin, controlling temperature and composition (mentioned later) becomes difficult. Needless to say, both cases are not preferred.

A light-transparent electrode 7 is formed on the contact layer 6, and an electrode 8 is formed on the high-carrier-concentration layer 3. On the electrode 7, a bonding electrode 9 is formed. The light-transparent electrode 7 which is in contact with the contact layer 6 is an ITO film (thickness: about 150 nm), the electrode 8 is a vanadium (V) film (thickness: about 20 nm) and an aluminum (Al) film (thickness: about 1.8 µm), and the bonding electrode 9 is a gold (Au) film (thickness: about 2.0 µm).

Next, the method for producing the light-emitting device 10 will be described. The aforementioned light-emitting device 10 was produced through metal-organic vapor phase epitaxy (hereinafter abbreviated as "MOVPE"). The following gasses were employed: ammonia ($NH_3$), a carrier gas ($H_2$ or $N_2$), trimethylgallium ($Ga(CH_3)_3$, hereinafter abbreviated as "TMG"), trimethylaluminum ($Al(CH_3)_3$, hereinafter abbreviated as "TMA"), trimethylindium ($In(CH_3)_3$, hereinafter abbreviated as "TMI"), silane ($SiH_4$), and cyclopentadienylmagnesium ($Mg(C_5H_5)_2$, hereinafter abbreviated as "$Cp_2Mg$").

<Crystal Growth>

A sapphire substrate 1 whose main plane for growing is an a-plane was washed with an organic substance and cleaned through heat treatment, and fixed to a susceptor placed in an MOVPE reaction chamber. The substrate 1 was then baked at 1,100° C. in the reaction chamber under $H_2$ flow at normal pressure. Subsequently, the temperature of the substrate 1 was lowered to 400° C., and $H_2$, $NH_3$, and TMA were supplied to the chamber, to thereby form an AlN buffer layer 2 (thickness: about 25 nm). Subsequently, the temperature of the substrate 1 was maintained at 1,150° C., and $H_2$, $NH_3$, TMG, and silane were supplied to the chamber, to thereby form a high-carrier-concentration layer 3 formed of GaN (thickness: about 4.0 µm, electron concentration: $2 \times 10^{18}$/$cm^3$).

After formation of the high-carrier-concentration layer 3, the temperature of the substrate 1 was adjusted to 900° C., and $N_2$, $NH_3$, TMA, and TMG were supplied to the chamber, to thereby form an $Al_{0.1}Ga_{0.9}N$ layer 411 (thickness: about 5 nm) The TMA feed rate was decreased with lowering the temperature of the substrate 1. After the TMA feed rate had reached 0, the TMI feed rate was increased, to thereby form a region 42a (thickness: about 1.5 nm). During the course of temperature lowering, TMI feed rate was controlled such that an $In_{0.1}Ga_{0.9}N$ well layer 43 began to grow on a substrate 1 at temperature of 600° C. In Example 1, a first barrier layer 41 was formed from the $Al_{0.1}Ga_{0.9}N$ layer 411 (thickness: about 5 nm) and the region 42 (thickness: about 1.5 nm).

Figure 7:
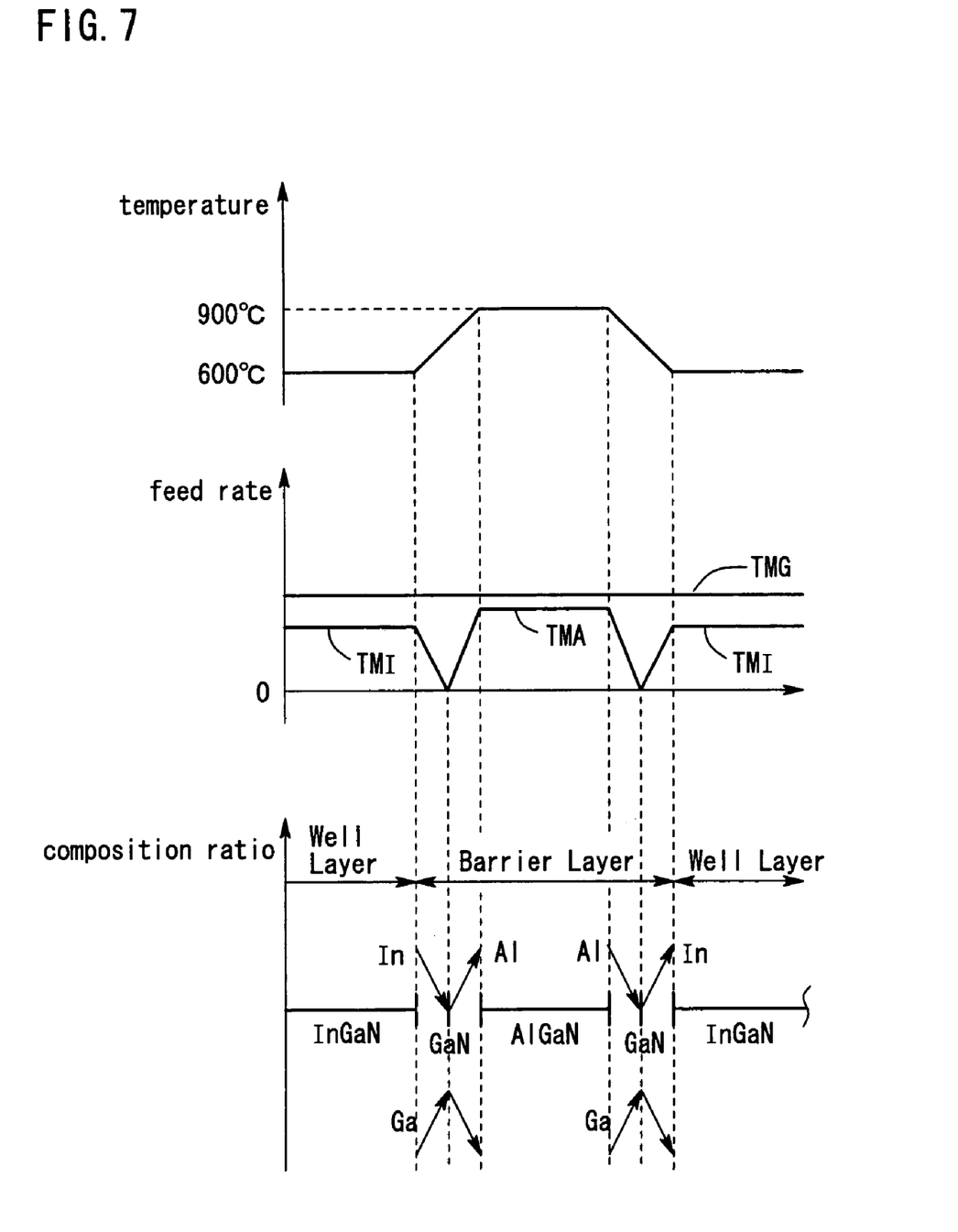
FIG. 7 is graph showing time-dependant change in growth temperature, metal source feed rate and composition ratio of growth crystal according to example 1.

Subsequently, $N_2$, $NH_3$, TMG, and TMI were supplied to the chamber, to thereby form an $In_{0.1}Ga_{0.9}N$ well layer 43 (thickness: about 3 nm). While feed rates $N_2$, $NH_3$, and TMG were maintained, the TMI feed rate was decreased with elevating the temperature of the substrate 1 as shown in FIG. 7. After the TMI feed rate had reached 0, the TMA feed rate was continuously increased from 0, to thereby form an interface region 42b (thickness: about 1.5 nm) joining to the upper surface of the well layer 43 as shown in FIG. 7. During the course of temperature elevation, TMA feed rate was controlled such that an $Al_{0.1}Ga_{0.9}N$ main region 411 of a second barrier layer 41 began to grow on a substrate 1 at temperature of 900° C. as shown in FIG. 7. Subsequently, $N_2$, $NH_3$, TMA, and TMG were supplied to the chamber, to thereby form an $Al_{0.1}Ga_{0.9}N$ layer 411 (thickness: about 5 nm).

Then, the TMA feed rate was decreased with lowering the temperature of the substrate 1. After the TMA feed rate had reached 0, the TMI feed rate was continuously increased from 0, to thereby form an interface region 42a (thickness: about 1.5 nm). During the course of temperature lowering, TMI feed rate was controlled such that an $In_{0.1}Ga_{0.9}N$ well layer 43 began to grow on a substrate 1 at temperature of 600° C. as shown in FIG. 7. Therefore, the second barrier layer 41 (total thickness: about 8 nm) comprised the $Al_{0.1}Ga_{0.9}N$ main region 411 (thickness: about 5 nm) and the interface regions 42a and 42b (each thickness: about 1.5 nm) which are present in the upper and lower interfaces of the main region.

Figure 3:
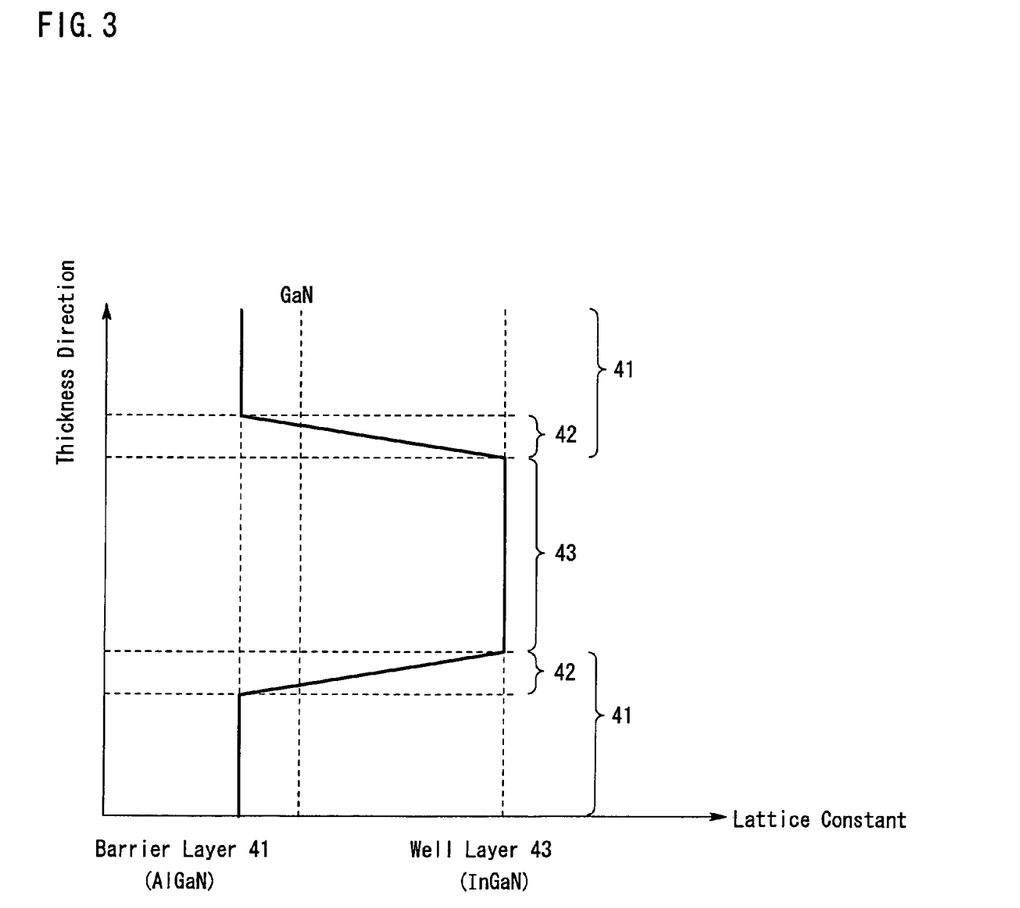
FIG. 3 is a graph showing the relationship between material composition and lattice constant regarding the barrier layer 41 (including the first and second regions 42) and the well layer 43 in the Group III nitride-based compound semiconductor light-emitting device of Example 1 of the present invention.

Formation of the barrier layer and the well layer was repeated. After formation of the final well layer, while feed rates $N_2$, $NH_3$, and TMG were maintained, the TMI feed rate was decreased with elevating the temperature of the substrate 1. After the TMI feed rate had reached 0, the TMA feed rate was increased, to thereby form an interface region 42b (thickness: about 1.5 nm) joining to the upper surface of the well layer 43. During the course of temperature elevation, TMA feed rate was controlled such that an $Al_{0.1}Ga_{0.9}N$ main region 411 of the subsequent barrier layer 41 began to grow on a substrate 1 at temperature of 900° C. Subsequently, $N_2$, $NH_3$, TMA, and TMG were supplied to the chamber, to thereby form an $Al_{0.1}Ga_{0.9}N$ layer 411 (thickness: about 5 nm). Therefore, the final barrier layer 41 (total thickness: about 5.5 nm) comprised the interface region 42b (thickness: about 1.5 nm) and the $Al_{0.4}Ga_{0.9}N$ main region 411 (thickness: about 5 nm) (see FIG. 3).

Subsequently, the temperature of the substrate 1 was maintained at 1,000° C., and $H_2$, $N_2$, $NH_3$, TMA, TMG, and $CP_2Mg$ were supplied to the chamber, to thereby form a cladding layer 5 formed of magnesium (Mg)-doped p-type $Al_{0.4}Ga_{0.6}N$ (thickness: about 20 nm, dopant concentration: $5 \times 10^{19}/cm^3$). Subsequently, $H_2$, $N_2$, $NH_3$, TMG, and $CP_2Mg$ were supplied to the chamber, to thereby form a contact layer 6 formed of magnesium (Mg)-doped p-type GaN (thickness: about 100 nm, dopant concentration: $5 \times 10^{19}/cm^3$).

In the aforementioned growth steps, alternatively, the region 42a in which the composition varies from $Al_{0.1}Ga_{0.9}N$ (layer 411) to $In_{0.1}Ga_{0.9}N$ (well layer 43) may be formed through the following procedure. Specifically, the TMA feed rate is gradually decreased, while the temperature at which the layer 411 is grown (e.g., 900° C.) is maintained, to thereby form a region in which the Al composition decreases toward formation of GaN. Then, while GaN is grown or gas feeding is stopped, the temperature was lowered to a temperature at which an $In_{0.1}Ga_{0.9}N$ well layer 43 is grown (e.g., 600° C.). Subsequently, while the temperature is maintained at 600° C., other gases are supplied to thereby gradually increase TMI, whereby a region in which the In composition increases toward formation of $In_{0.1}Ga_{0.9}N$ is formed.

Figure 8:
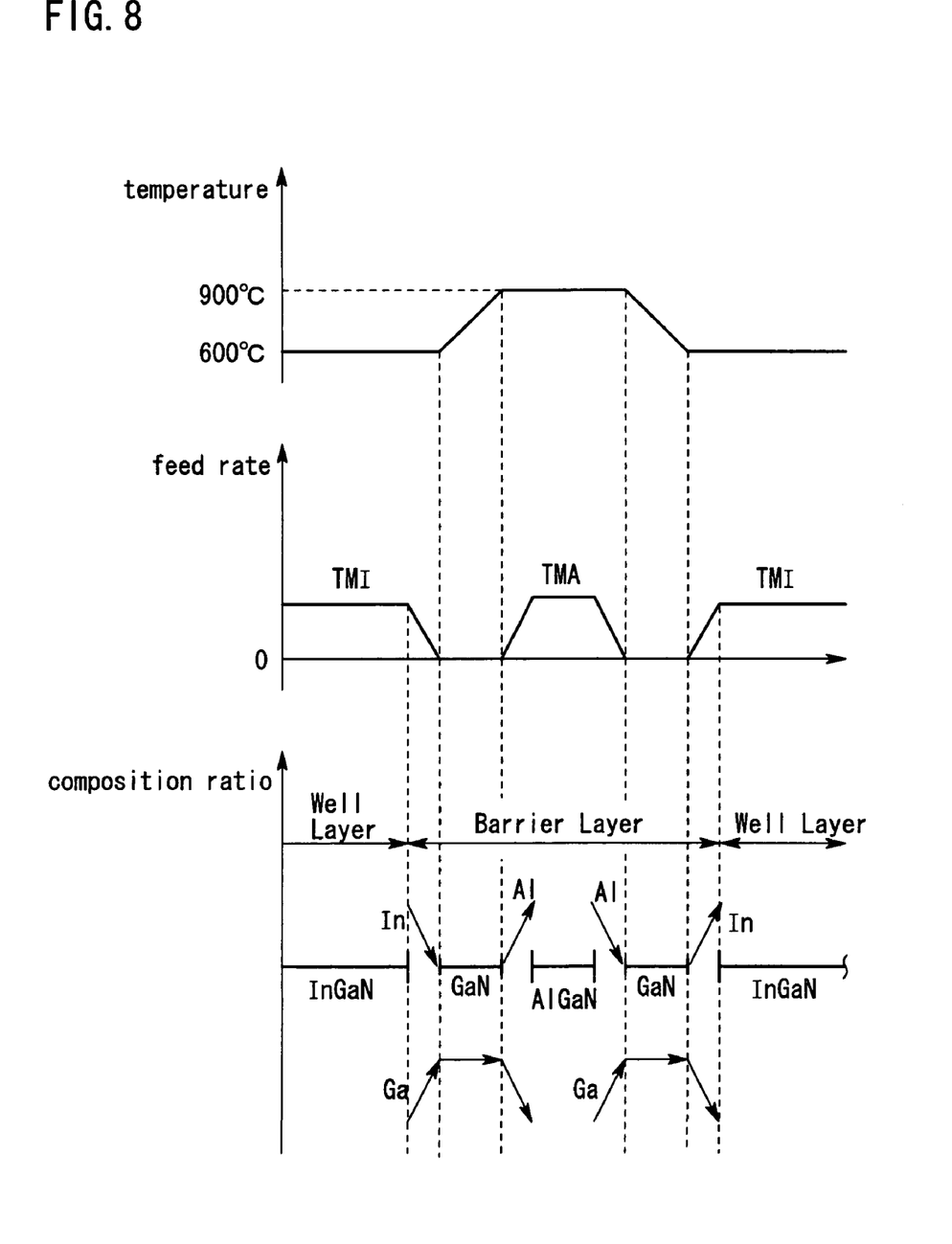
FIG. 8 is graph showing time-dependant change in growth temperature, metal source feed rate and composition ratio of growth crystal according to modification of example 1.

Alternatively, the region 42b in which the composition varies from $In_{0.1}Ga_{0.9}N$ (well layer 43) to $Al_{0.1}Ga_{0.9}N$ (layer 411) may be formed through the following procedure. Specifically, the TMI feed rate is gradually decreased, while the temperature at which the well layer 43 is grown (e.g., 600° C.) is maintained, to thereby form a region in which the In composition decreases toward formation of GaN as shown in FIG. 8. Then, while GaN is grown or gas feeding is stopped, the temperature was elevated to a temperature at which an $Al_{0.1}Ga_{0.9}N$ layer 411 is grown (e.g., 900° C.). Subsequently, while the temperature is maintained at 900° C., other gases are supplied to thereby gradually increase the TMA feed rate, whereby a region in which the Al composition increases toward formation of $Al_{0.1}Ga_{0.9}N$ is formed as shown in FIG. 8.

Thus, composition-varying regions 42a and 42b may be formed through the aforementioned procedure.

<Formation of Electrode>

An etching mask was formed on the contact layer 6, and a predetermined region of the etching mask was removed. A region of the contact layer 6 which was not covered with the etching mask, and the corresponding regions of the cladding layer 5, the multiple quantum well layer 4, and a portion of the high-carrier-concentration layer 3 were etched through reactive ion etching by use of a chlorine-containing gas, to thereby expose a surface of the high-carrier-concentration layer 3. Subsequently, a photoresist was applied to the entire surface of the stacked body without removing the etching mask, and an opening was provided in a predetermined region of the exposed surface of the high-carrier-concentration layer 3 through photolithography. In the opening, an electrode 8 formed of a vanadium (V) film (thickness: about 20 nm) and an Al film (thickness: about 1.8 μm) was formed.

<Formation of Light-Transparent Electrode>

A photoresist was applied to the surface of the contact layer 6, and a portion of the photoresist corresponding to the region where a light-transparent electrode was to be formed was removed through photolithography, to thereby provide an opening, through which the contact layer 6 was exposed. On the thus-exposed contact layer 6, an ITO film (thickness: about 150 nm) was formed. The semiconductor stacked substrate was removed from the apparatus, and a portion of the ITO film deposited on photoresist was removed through the lift-off technique, to thereby form an electrode 7 which is light-transparent with respect to the contact layer 6.

<Formation of Bonding Electrode>

A photoresist was applied to the surface of the light-transparent electrode 7, and a portion of the photoresist corresponding to the region where a bonding electrode was to be formed was removed through photolithography, to thereby provide an opening, through which the light-transparent electrode 7 was exposed. On the thus-exposed light-transparent electrode 7, an Au film (thickness: about 2.0 μm) was formed. The semiconductor stacked substrate was removed from the apparatus, and a portion of the Au film deposited on photoresist was removed through the lift-off technique, to thereby form a bonding electrode 9.

After formation of these electrodes, the chamber where the semiconductor stacked substrate was placed was evacuated by means of a vacuum pump, and $O_2$ gas was fed to the chamber, to thereby adjust the chamber pressure to 3 Pa. Subsequently, the atmosphere temperature was elevated to about 500° C., and the stacked body was heated for about three minutes, to thereby make the contact layer 6 and the cladding layer 5 to p-type low-resistive layers, and perform alloying between the contact layer 6 and the electrode 7 and between the high-carrier-concentration layer 3 and the electrode 8.

Example 2

In Example 1, the composition of the interface region 42a in contact with the lower surface of the well layer 43 is varied from AlGaN, via GaN, to InGaN. Alternatively, the composition of the interface region 42a may be varied from AlGaN to GaN, and this compositional variation is also effective. In the case, the following procedure was employed. After formation of the high-carrier-concentration layer 3, the temperature of the substrate 1 was adjusted to 900° C., and $N_2$, $NH_3$, TMA, and TMG were supplied to the chamber, to thereby form an $Al_{0.1}Ga_{0.9}N$ main region 411 (thickness: about 5 nm). The TMA feed rate was continuously decreased to 0 with lowering the temperature of the substrate 1, to thereby form a region 42a (thickness: about 1.5 nm) which is in contact with the lower surface of the well layer 43. During the course of temperature lowering, the TMA feed rate was controlled to 0 when the temperature of the substrate 1 reached 600° C. In Example 2, a first barrier layer 41 was formed from the $Al_{0.1}Ga_{0.9}N$ main region 411 (thickness: about 5 nm) and the interface region 42a (thickness: about 1.5 nm).

Figure 9:
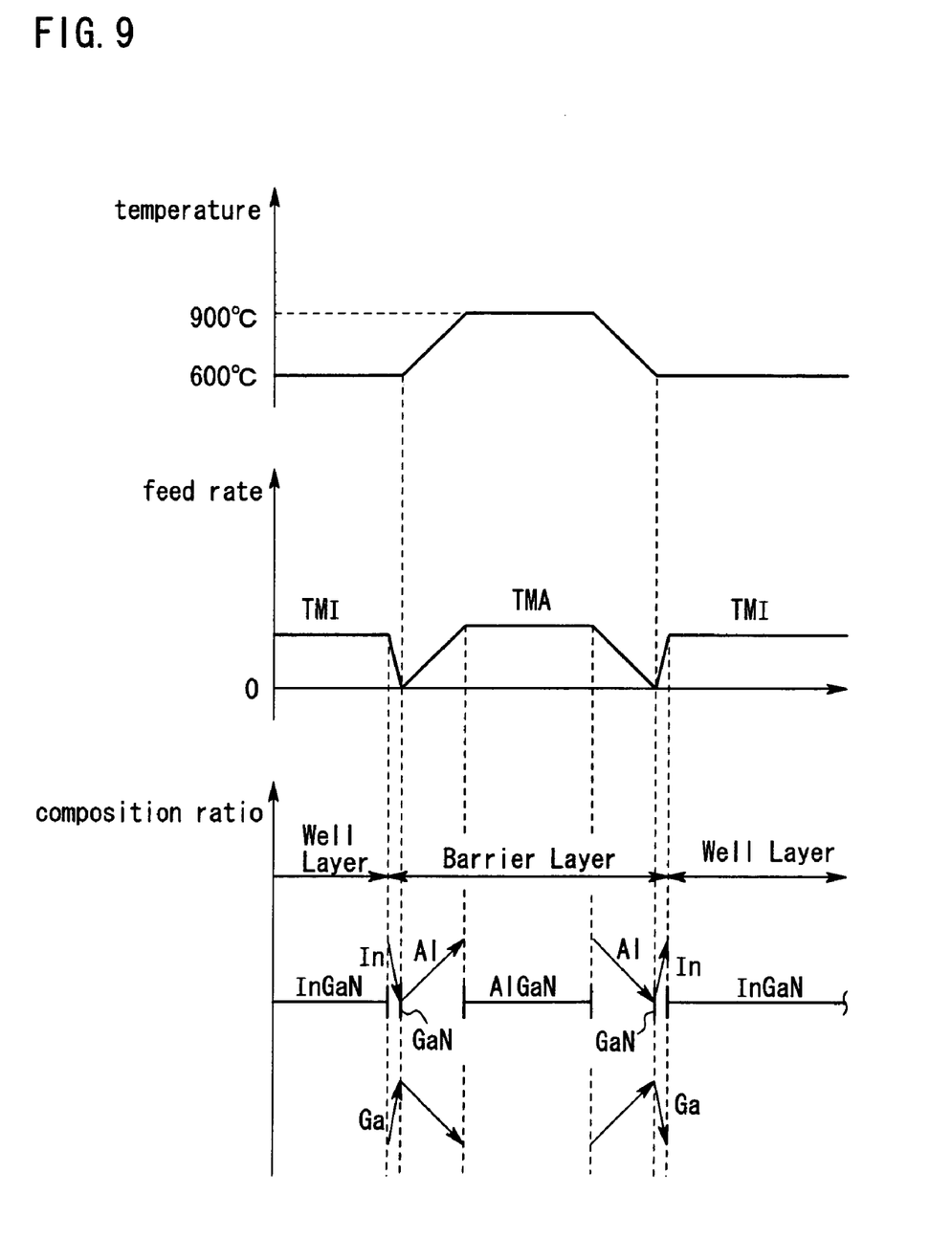
FIG. 9 is graph showing time-dependant change in growth temperature, metal source feed rate and composition ratio of growth crystal according to example 2.

Subsequently, $N_2$, $NH_3$, TMG, and TMI were supplied to the chamber, to thereby form a first $In_{0.1}Ga_{0.9}N$ well layer 43 (thickness: about 3 nm). While feed rates $N_2$, $NH_3$, and TMG were maintained, feeding of TMI was stopped, and the TMA feed rate was continuously increased from 0 with elevating the temperature of the substrate 1, to thereby form an interface region 42b (thickness: about 1.5 nm) joining to the upper surface of the well layer 43 as shown in FIG. 9. During the course of temperature elevation, the TMA feed rate was continuously increased such that an $Al_{0.1}Ga_{0.9}N$ main region 411 of a second barrier layer 41 began to grow on a substrate 1 at temperature of 900° C. as shown in FIG. 9. Subsequently, $N_2$, $NH_3$, TMA, and TMG were supplied to the chamber, to thereby form a second $Al_{0.1}Ga_{0.9}N$ main region 411 (thickness: about 5 nm) as shown in FIG. 9. Then, the TMA feed rate was decreased with lowering the temperature of the substrate 1, to thereby form a second interface region 42a (thickness: about 1.5 nm). During the course of temperature lowering, the TMA feed rate was controlled such that when the TMA feed rate reached 0 to form GaN, the temperature of the substrate 1 is 600° C. as shown in FIG. 9. Therefore, the second barrier layer 41 (total thickness: about 8 nm) was formed from the $Al_{0.1}Ga_{0.9}N$ main region 411 (thickness: about 5 nm) and the interface regions 42a and 42b (each thickness: about 1.5 nm) which were present on the upper and lower surfaces of the main region.

Formation of the barrier layer and the well layer was repeated. After formation of the final well layer, while feed rates $N_2$, $NH_3$, and TMG were maintained, feeding of TMI was stopped and the TMA feed rate was continuously increased with elevating the temperature of the substrate 1, to thereby form an interface region 42b (thickness: about 1.5 nm) joining to the upper surface of the final well layer 43. During the course of temperature elevation, TMA feed rate was controlled such that an $Al_{0.1}Ga_{0.9}N$ main region 411 of the final barrier layer 41 began to grow on a substrate 1 at temperature of 900° C. Subsequently, $N_2$, $NH_3$, TMA, and TMG were supplied to the chamber, to thereby form an $Al_{0.1}Ga_{0.9}N$ layer 411 (thickness: about 5 nm). Therefore, the final barrier layer 41 (total thickness: about 5.5 nm) was formed from the interface region 42b (thickness: about 1.5 nm) in contact with the upper surface of the final well layer 43, and the $Al_{0.1}Ga_{0.9}N$ main region 411 (thickness: about 5 nm).

<Results>

In Example 1, the composition of the interface region 42a in contact with the lower surface of the well layer 43 was varied from AlGaN, via GaN, to InGaN, and the composition of the interface region 42b in contact with the upper surface of the well layer 43 was varied from InGaN, via GaN, to AlGaN. A light-emitting device having such interface regions exhibited an increased (about 15%) luminance, as compared with a similar light-emitting device not having such interface regions.

In Example 2 composition of the interface region 42a in contact with the lower surface of the well layer 43 was varied from AlGaN to GaN, and the composition of the interface region 42b in contact with the upper surface of the well layer 43 was varied from GaN to AlGaN. A light-emitting device having such interface regions exhibited an increased (about 10%) luminance, as compared with a similar light-emitting device not having such interface regions. In both cases, the emission spectrum of the devices having such interface regions was identical to that of the light-emitting devices not having such interface regions 42a and 42b.

In the above Examples, a multiple quantum well structure was employed. However, even when a single quantum well structure is employed, the similar effect can be attained, in the case where interface regions 42a and 42b in contact with the well layer are provided in respective barrier layers. In the case of a single quantum well structure, the interface regions 42a and 42b may be provided in respective cladding layers instead of barrier layers, so long as the cladding layers are in contact with the well layer.

In MWQ and SQW, the aforementioned composition-varying interface regions 42a and 42b are not necessarily provided in respective cladding layers or barrier layers, and may be provided in any layers so long as the layers are in contact with the well layer. Alternatively, the aforementioned composition-varying interface regions 42a and 42b may be provided in layers each interposed between the well layer and a cladding layer or a barrier layer. Still alternatively, the interface regions 42a and 42b per se may be provided in the form of layers each interposed between the well layer and a cladding layer or a barrier layer.

Briefly, interface regions are formed so as to join the well layer such that the lattice constant approaches the lattice constant of the well layer. In other words, each interface region in which the lattice constant gradually varies is interposed between the well layer and a component layer neighboring the well layer such that the difference in lattice constant between the well layer and the component layer is minimized. Emission efficiency can be enhanced through provision of such composition-varying interface regions on both surface of the well layer.

The light-emitting devices of Examples 1 and 2 employ a well layer interposed between two barrier layers. Alternatively, when an MQW structure starting from the well layer or an MQW structure having a barrier layer on one side; e.g., well layer/barrier layer/ . . . /well layer/barrier layer/cladding layer, is employed, similar effects can be attained.

The second and third aspects of the present invention will next be described.

In the present invention, Group III nitride semiconductors at least include 2-component, 3-component-, and 4-component Group III nitride-based compound semiconductors represented by $Al_xGa_yIn_{1-x-y}N$ ($0 \leq x \leq 1$, $0 \leq y \leq 1$, $0 \leq x+y \leq 1$). The Group III elements may be partially substituted by boron (B) or thallium (Tl), and nitrogen (N) may be partially substituted by phosphorus (P), arsenic (As), antimony (Sb), or bismuth (Bi).

In the case where an n-type Group III nitride-based compound semiconductor layer is formed from these semiconductors, an n-type impurity element such as Si, Ge, Se, Te, or C may be added. Similarly, in the case of p-type, a p-type impurity element such as Zn, Mg, Be, Ca, Sr, or Ba may be added.

The Group III nitride-based compound semiconductor layer is grown through metal-organic vapor phase epitaxy (MOVPE) or hydride vapor phase epitaxy (HVPE). Of these, MOVPE is particularly preferred.

In carrying out the present invention, any carrier gases may be used so long as hydrogen or nitrogen is a predominant component thereof. These carrier gas may further contain a trace amount of inert gas such as argon. In some cases, source gases, carrier gases, and other impurities which have been present in an epitaxial growth apparatus for other layers before growth of an epitaxial layer of interest are migrated into the carrier gas (i.e., memory effect). Needless to say, a carrier gas containing such impurities also falls within the scope of the present invention.

In the production of a Group III nitride-based compound semiconductor device, the method of the present invention is applied at least to the growth of an indium-containing Group III nitride-based compound semiconductor layer. No particular limitation is imposed on the growth conditions for forming other layers employed in the present invention. In the case in which the semiconductor device is a light-emitting device, examples of the light-emitting device include a light-emitting diode (LED), a laser diode (LD), a photocoupler, and any type of light-emitting devices. Except for the growth of an indium-containing Group III nitride-based compound semiconductor layer, a known method for producing a Group III nitride-based compound semiconductor light-emitting device may be employed.

Examples of the material of the substrate on which semiconductor layers are grown include sapphire, spinel, Si, SiC, ZnO, MgO, or a Group III nitride-based compound single crystal.

The light-emitting layer employed in the present invention may assume a single layer or may have any structure such as a single quantum well (SQW) structure or a multiple quantum well (MQW) structure. When a multiple quantum well (MQW) structure is employed for the light-emitting layer, it preferably has a well layer at least formed of a indium (In)-containing Group III nitride-based compound semiconductor represented by $Al_yGa_{1-y-z}In_zN$ ($0 \leq y<1$, $0<z \leq 1$). For example, the light-emitting layer has a non-doped $Ga_{1-z}In_zN$ ($0<z \leq 1$) well layer and a barrier layer formed of a Group III nitride-based compound semiconductor (AlGaInN with arbitrary composition) having a bandgap wider than that of the well layer. A combination of a non-doped $Ga_{1-z}In_zN$ ($0<z \leq 1$) well layer and a non-doped GaN barrier layer is preferred.

In the following Example 3, a sapphire substrate was employed as a wafer, and a light-emitting device was produced through metal-organic vapor phase epitaxy (hereinafter abbreviated as "MOVPE"). The following gasses were employed: $NH_3$, a carrier gas ($H_2$ or $N_2$), trimethylgallium ($Ga(CH_3)_3$, hereinafter abbreviated as "TMG"), trimethylaluminum ($Al(CH_3)_3$), trimethylindium ($In(CH_3)_3$, hereinafter abbreviated as "TMI"), silane ($SiH_4$), and cyclopentadienylmagnesium ($Mg (C_5H_5)_2$).

Example 3

Figure 4:
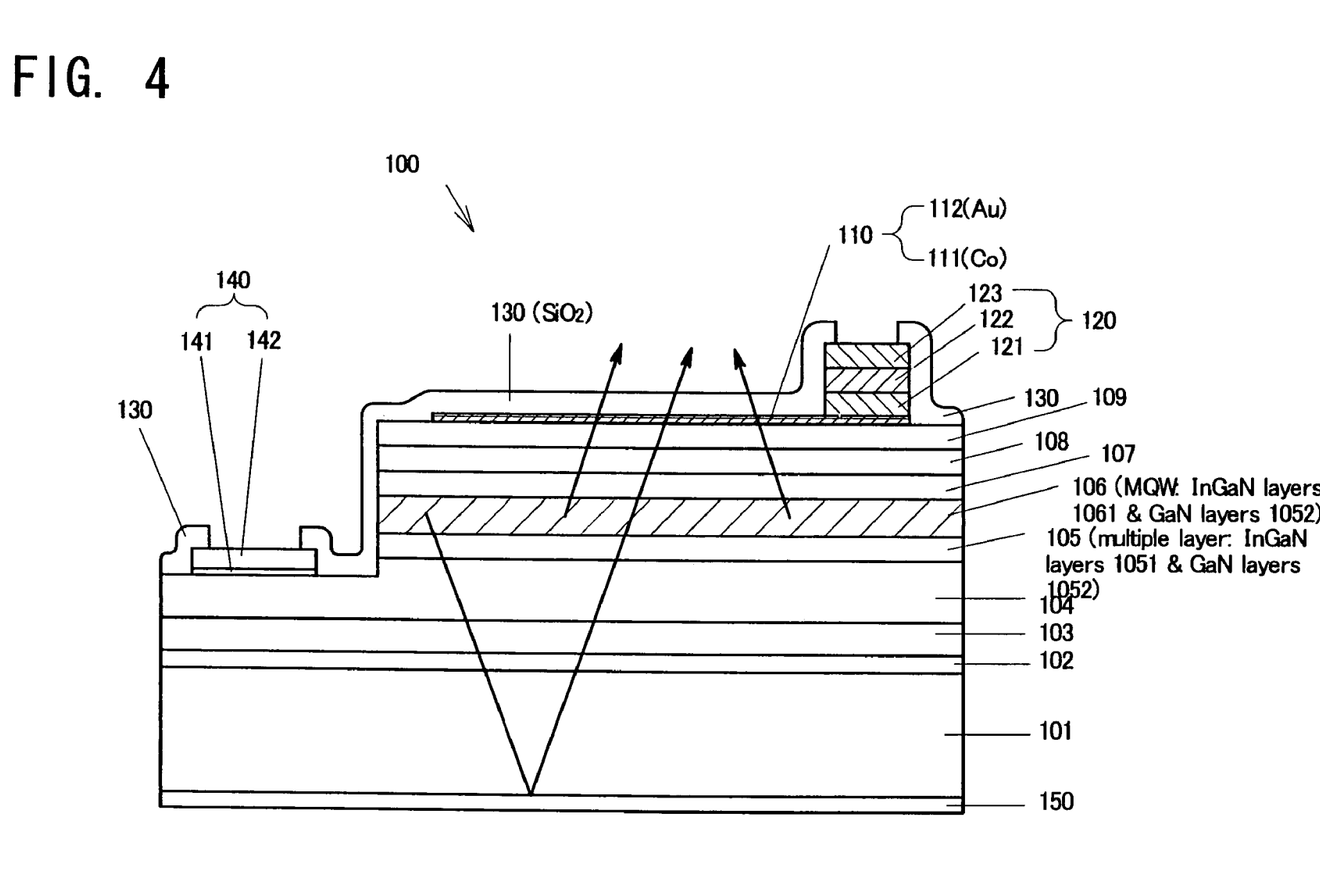
FIG. 4 is a cross-sectional view of a Group III nitride-based compound semiconductor light-emitting device 100 of Example 3 of the present invention.

FIG. 4 is a schematic cross-sectional view of a Group III nitride-based compound semiconductor light-emitting device 100 of Example 3 of the present invention. As shown in FIG. 4, in the semiconductor light-emitting device 100, an aluminum nitride (AlN) buffer layer 102 (thickness: about 10 nm), a non-doped GaN layer 103 (thickness: about 2 µm), and an n-type contact layer 104 (high-carrier-concentration n+ layer) (thickness: about 3 µm) formed of silicon (Si)-doped GaN with a dopant amount of $5\times10^{18}/cm^3$ were sequentially formed on a sapphire substrate 101 (thickness: about 300 µm).

On the n-type contact layer 104, a multilayer 105 (thickness 40 nm) and a light-emitting layer 106 of a multiple quantum well structure were sequentially formed, the multilayer 105 comprising stacked 20 pairs of a non-doped $In_{0.1}Ga_{0.9}N$ layer 1051 (thickness: 1 nm) and a non-doped GaN layer 1052 (thickness: 1 nm), and the light-emitting layer 106 comprising stacked 6 pairs of a non-doped $In_{0.2}Ga_{0.8}N$ well layer 1061 (thickness: 3 nm) and a non-doped GaN barrier layer 1062 (thickness: 17 nm).

On the light-emitting layer 106, an p-type layer 107 (thickness: 15 nm) formed of Mg-doped p-type $Al_{0.2}Ga_{0.8}N$ with a dopant amount of $2\times10^{19}/cm^3$ was formed. On the p-type layer 107, a non-doped $Al_{0.02}Ga_{0.98}N$ layer 108 (thickness: 300 nm) and a p-type contact layer 109 (thickness: 200 nm) formed of Mg-doped p-type GaN with a dopant amount of $1\times10^{20}/cm^3$ were sequentially formed.

A light-transparent thin-film p-electrode 110 was formed on the p-type contact layer 109 through metal vapor deposition, and an n-electrode 140 was formed on the n-type contact layer 104. The light-transparent thin-film p-electrode 110 included a first layer 111 and a second layer 112, the first layer 111 comprising a cobalt (Co) film (thickness: about 1.5 nm) which directly contacted with the p-type contact layer 109, and the second layer 112 comprising a gold (Au) film (thickness: about 6 nm) which contacted with the cobalt film.

A thick-film p-electrode 120 was fabricated by sequentially depositing, on the light-transparent thin-film p-electrode 110, a first layer 121 (thickness: about 18 nm) formed of vanadium (V), a second layer 122 (thickness: about 1.5 µm) formed of gold (Au), and a third layer 123 (thickness: about 10 nm) formed of aluminum (Al).

The n-electrode 140 of a multilayer structure was fabricated by sequentially depositing, on an exposed portion of the n-type contact layer 104, a first layer 141 (thickness: about 18 nm) formed of vanadium (V) and a second layer 142 (thickness: about 100 nm) formed of aluminum (Al).

The uppermost surface of the semiconductor stacked substrate was coated with a $SiO_2$ protective film 130.

On the bottom outer surface of the sapphire substrate 101, a metal reflecting layer 150 (thickness: about 500 nm) formed of aluminum (Al) was formed through metal vapor deposition. The metal reflecting layer 150 may be formed of metallic material such as Rh, Ti, or W, or a nitride such as TiN or HfN.

During the production of semiconductor light-emitting device 100 shown in FIG. 4, the non-doped $In_{0.2}Ga_{0.8}N$ well layers 1061 (thickness: 3 nm) were formed with modification of the TMI feed rate as follows. At the start of the production of the light-emitting layer 106, TMI and TMG were fed to the exhaust system through shift valve operation and subjected to bubbling at predetermined feed rates regulated by means of mass flow controllers. During formation of the well layers 1061, TMI and TMG were fed to the reaction system, whereas upon formation of the barrier layers 1062, only TMG was fed to the reaction system, through shit valve operation, respectively. Upon formation of each well layer 1061, feeding of TMI was initiated at a 5% level of the target feed rate, and the feed rate was increased to the target feed rate over 10 seconds. Thereafter, the feed rate was maintained at the target level. From 10 seconds before completion of formation of the well layer 1061, the TMI feed rate was decreased from the target feed rate to the 5% level of the target feed rate. The feed rates of other materials and sources remained unchanged from the start to the end of formation of the well layers 1061.

The thus-fabricated semiconductor light-emitting device 100 attained light emission of an emission wavelength of 468 nm and a luminance of 142 µW.

Comparative Example

The procedure of Example 3 was repeated, except that the TMI feed rate was maintained at a target feed rate from the start to the end of the formation of the well layers 1061, to thereby fabricate a semiconductor light-emitting device 100. The thus-fabricated device attained light emission of an emission wavelength of 468 nm and a luminance of 134 µW.

As is clear from the results of Example 3 and Comparative Example, luminance can be elevated by 6% through modification of the TMI feed rate at the start and end of formation of the well layers 1061 without changing the total formation time of the layers. As mentioned above, one conceivable reason for enhancement of luminance is that recombination of electrons and holes is effectively promoted through suppressing formation of compositionally unstable regions.

What is claimed is:

1. A Group III nitride-based compound semiconductor light-emitting device having a quantum well, structure, the device comprising:

a multiple quantum well layer comprising plural well layers each having the same composition ratio and plural barrier layers each having the same composition ratio; and plural interface regions formed between each of said plural well layers and each of said plural barrier layers, each interface region of the plural interface regions having the same composition distribution, wherein the plural barrier layers consist of $Al_xGa_{1-x}N$ (0<x<1), and the plural well layers consist of $In_yGa_{1-y}N$ (0<y<1), and wherein the plural interface regions consist of:

a first part consisting of $In_{y'}Ga_{1-y'}N$ (0≦y'<1) positioned on a side of said interface regions which is nearest to said well layers, y' continuously varying from y to 0 as a distance from the well layers increases;

a second part consisting of $Al_{x'}Ga_{1-x'}N$ (0≦x'<1) positioned on a side of said interface regions which is farthest from said well layers, x' continuously varying from 0 to x as a distance from the well layers increases; and a GaN region formed between the first part and the second part.

2. A Group III nitride-based compound semiconductor light-emitting device according to claim 1, wherein said MQW structure is formed on a sapphire substrate.

3. A Group III nitride-based compound semiconductor light-emitting device according to claim 1, wherein a thickness of an interface region of said plural interface regions is about 1.5 nm.

4. A Group III nitride-based compound semiconductor light-emitting device according to claim 1, wherein said plural well layers are separated by a barrier layer in said plural barrier layers and a pair of interface regions of said plural interface regions, and
wherein a thickness of an interface region of said pair of interface regions is in a range from 1/40 to 3/8 of a total thickness of said barrier layer and said pair of interface regions.

5. A Group III nitride-based compound semiconductor light-emitting device according to claim 1, wherein said plural well layers comprise three well layers and said plural barrier layers comprise four barrier layers.

6. A Group III nitride-based compound semiconductor light-emitting device according to claim 1, wherein said plural well layers comprise $In_{0.1}Ga_{0.9}N$ and said plural barrier layers comprise $Al_{0.4}Ga_{0.6}N$.

7. A Group III nitride-based compound semiconductor light-emitting device according to claim 1, wherein said y' gradually varies from y to 0 in said first part, and x' gradually varies from 0 to x in said second part.

8. A Group III nitride-based compound semiconductor light-emitting device according to claim 1, wherein in said first part of said plural interface regions, y' gradually varies from y to 0 as a distance from the well layers increases, and in said second part of said plural interface regions, x' gradually varies from 0 to x as a distance from the well layers increases.

9. A Group III nitride-based compound semiconductor light-emitting device according to claim 1, wherein said GaN region of said plural interface regions comprises a predetermined width.

10. A multiple quantum well (MQW) structure for a Group III nitride-based compound semiconductor light-emitting device, said MQW structure comprising:
plural well layers having a first composition, each of said plural well layers having the same composition;
plural barrier layers formed between said plural well layers and having a second composition, each of said plural barrier layers having the same composition; and
an interface region formed between a well layer of said plural well layers and a barrier layer of said plural barrier layers, said interface region consisting of:
a first portion formed near said well layer and having a composition which is near to said first composition;
a second portion formed near said barrier layer and having a composition which is near to said second composition; and
a third portion formed between said first and second portions and having a composition which gradually changes from said composition which is near to said second composition, to said composition which is near to said first composition as a position approaches said well layer,
wherein the plural barrier layers consist of $Al_xGa_{1-x}N$ (0<x<1), and the plural well layers consist of $In_yGa_{1-y}N$ (0<y<1), and
wherein the interface region consists of:
a first part consisting of $In_{y'}Ga_{1-y'}N$ (0≦y'≦1) positioned on a side of said interface region which is nearest to said well layers, y' continuously varying from y to 0 as a distance from the well layers increases;
a second part consisting of $Al_{x'}Ga_{1-x'}N$ (0≦x'<1) positioned on a side of said interface region which is farthest from said well layers, x' continuously varying from 0 to x as a distance from the well layers increases; and
a GaN region formed between the first part and the second part.

11. A multiple quantum well (MQW) structure for a Group III nitride-based compound semiconductor light-emitting device according to claim 10, wherein said MQW structure is formed on a sapphire substrate.

12. A multiple quantum well layer for a Group III nitride-based compound semiconductor light-emitting device, the multiple quantum well layer comprising:
a well layer comprising $In_yGa_{1-y}N$ (0<y<1);
a barrier layer comprising $Al_xGa_{1-x}N$ (0<x<1); and
an interface region formed between said well layer and said barrier layer, said interface region comprising:
a first part comprising $In_{y'}Ga_{1-y'}N$ (0≦y'<1) formed on a side of said interface region which is nearest to said well layer, y' continuously varying from y to 0 as a distance from the well layer increases;
a second part comprising $Al_{x'}Ga_{1-x'}N$ (0≦x'<1) formed on a side of said interface region which is farthest from said well layer, x' continuously varying from 0 to x as a distance from the well layer increases; and
a GaN region formed between the first part and to second part.

13. The multiple quantum well layer of claim 12, wherein said well layer consists essentially of $In_yGa_{1-y}N$ (0<y<1), said barrier layer consists essentially of $Al_xGa_{1-x}N$ (0<x<1), said first part of said interface region consists essentially of $In_{y'}Ga_{1-y'}N$ (0≦y'<1), and said second part of said interface region consists essentially of $Al_{x'}Ga_{1-x'}N$ (0≦x<1).

* * * * *

UNITED STATES PATENT AND TRADEMARK OFFICE
CERTIFICATE OF CORRECTION

PATENT NO.         : 7,629,619 B2
APPLICATION NO.    : 11/340746
DATED              : December 8, 2009
INVENTOR(S)        : Tetsuya Taki et al.

Page 1 of 1

It is certified that error appears in the above-identified patent and that said Letters Patent is hereby corrected as shown below:

On the Title Page Item (73) Assignee: replace "Toyota Gosei Co., Ltd.," with "Toyoda Gosei Co., Ltd."

Column 14, line 40, replace "light-emitting device having a quantum well, structure, the" with "light-emitting device having a quantum well structure, the"

Column 14, line 54, replace "a first part consisting of $In_yGa_{1-y}N$ ($0 \leq y' < 1$) positioned" with "a first part consisting of $In_{y'}Ga_{1-y'}N$ ($0 \leq y' < 1$) positioned"

Column 16, line 11, replace "a first part consisting of $In_yGa_{1-y}N$ ($0 \leq y' < 1$) positioned" with "a first part consisting of $In_{y'}Ga_{1-y'}N$ ($0 \leq y' < 1$) positioned"

Column 16, line 42, replace "a GaN region formed between the first part and to second" with "a GaN region formed between the first part and the second"

Column 16, line 49, replace "region consists essentially of $Al_xGa_{1-x}N$ ($0 \leq x < 1$)." with "region consists essentially of $Al_{x'}Ga_{1-x'}N$ ($0 \leq x' < 1$)."

Signed and Sealed this

Sixteenth Day of March, 2010

David J. Kappos
*Director of the United States Patent and Trademark Office*